United States Patent [19]

Jaeger

[11] Patent Number: 5,029,273
[45] Date of Patent: Jul. 2, 1991

[54] INTEGRATED OPTICS POCKELS CELL VOLTAGE SENSOR

[75] Inventor: Nicolas A. F. Jaeger, Richmond, Canada

[73] Assignee: The University of British Columbia

[21] Appl. No.: 473,747

[22] Filed: Feb. 2, 1990

[51] Int. Cl.$^5$ .................. G01R 31/00; G01R 27/02
[52] U.S. Cl. ........................ 324/96; 324/158 D;
      324/158 R; 350/96.12; 350/356; 356/365; 356/368
[58] Field of Search .............. 324/96, 77 K, 158 R,
      324/158 D; 350/377, 378, 96.11, 96.12, 96.13,
      96.14; 356/364–365, 368

[56] References Cited

U.S. PATENT DOCUMENTS

| | | | |
|---|---|---|---|
| 4,206,251 | 6/1980 | Chen | 350/96.12 |
| 4,334,774 | 6/1982 | Glass et al. | 350/96.12 |
| 4,510,441 | 4/1985 | Kasukabe | 350/356 |
| 4,618,819 | 10/1986 | Mourou et al. | 324/96 |
| 4,629,323 | 12/1986 | Matsumoto | 324/96 |
| 4,701,008 | 10/1987 | Richard et al. | 350/96.12 |
| 4,776,657 | 10/1988 | Reeder | 350/96.13 |
| 4,826,283 | 5/1989 | Chuangtian et al. | 350/96.12 |
| 4,880,288 | 11/1989 | Vatoux et al. | 350/96.12 |
| 4,918,373 | 4/1990 | Newberg | 350/96.29 |

FOREIGN PATENT DOCUMENTS 2212265A 7/1989 Japan.

Primary Examiner—Kenneth Wieder
Assistant Examiner—Vinh P. Nguyen
Attorney, Agent, or Firm—C. A. Rowley

[57] ABSTRACT

An integrated optics Pockels cell for use in a voltage sensor includes a crystal exhibiting the electro-optic effect in which an integratd straight line wave guide substantially aligned with a z axis of the crystal is incorporated. The wave guide has two substantially orthogonal polarization axes substantially aligned with an x and y axis of the crystal respectively. In operation light polarized at a selected angle of orientation to the x and y axes of the crystal is applied to one end of the wave guide and polarized light leaving the wave guide and polarized along two substantially orthogonal axes one of which is at about the same orientation to the x and y axes as the polarized light entering the wave guide is detected to determine the electric field to which the sensor has been subjected. Preferably the sensor will include polarization maintaining optical fibers appropriately oriented to the wave guide for delivering and receiving polarized light to and from the wave guide.

16 Claims, 1 Drawing Sheet

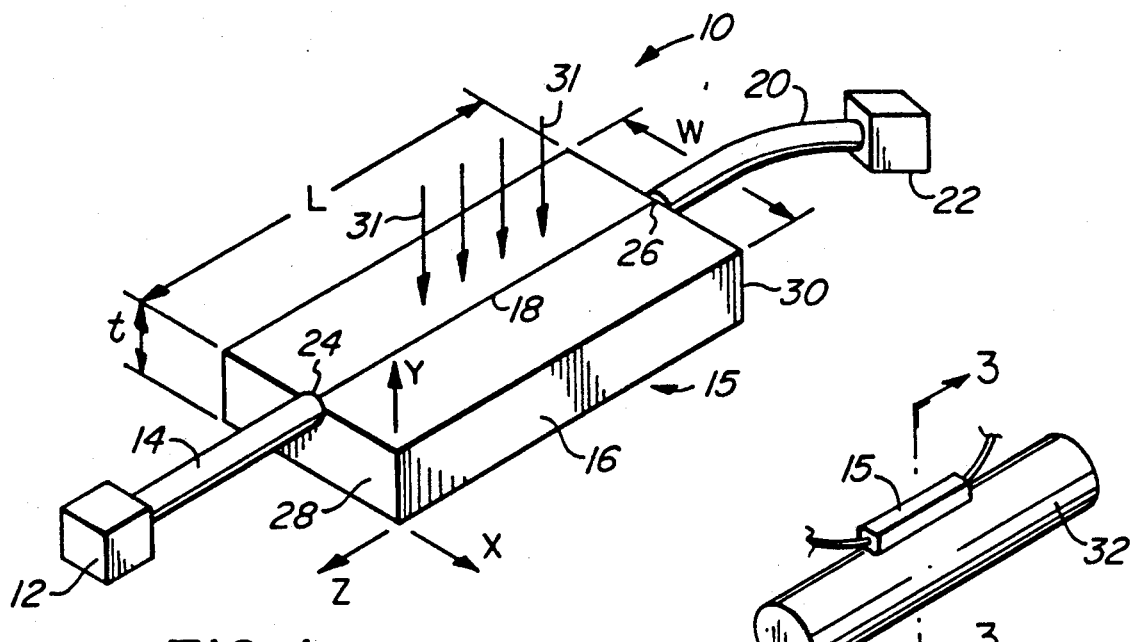
FIG. 1
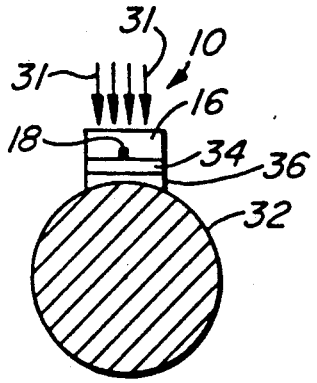
FIG. 2
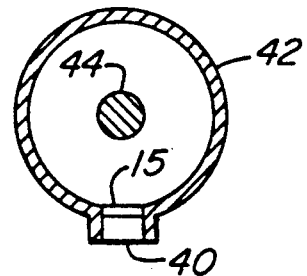
FIG. 3
FIG. 3A
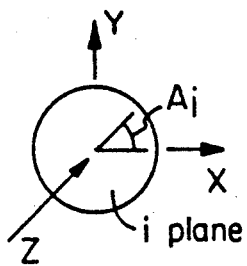
FIG. 4
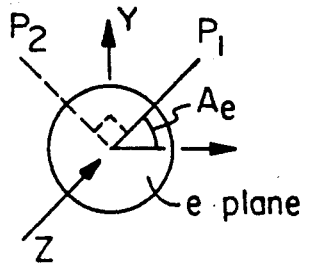
FIG. 5

INTEGRATED OPTICS POCKELS CELL VOLTAGE SENSOR

FIELD OF THE INVENTION

The present invention relates to an electric field detector more particularly the present invention relates to an electric field detector using an integrated optics Pockels cell.

BACKGROUND OF THE INVENTION

Pockels cells have been used in combination with polarized light to detect the magnitude and direction of an electric field influencing the Pockels cell by incorporating an analyzer to determine electric field strength, i.e. the amount of light leaving the Pockels cell and detected by the detector is dependent on the electric field applied to the Pockels cell crystal.

UK. Patent Application No. 2212265A published Jul. 19, 1989 by Takahashi et al. describes two types of conventional Pockels cells voltage detectors and an improved detector incorporating a Pockels cell but using a high speed photodetector.

U.S. Pat. No. 4,510,441 issued Apr. 9, 1985 to Kasukabe et al describes a Pockels cell field detector incorporating an improved crystal structure for use in such a detector.

Generally Pockels cell type voltage detectors are formed from a plurality of separate parts and are relatively easily damaged for example by vibration since it is imperative that the polarizer and the detector be accurately aligned with the Pockels cell to ensure meaningful light transmission. If proper alignment or consistent alignment is not maintained, the accuracy of the Pockels cell as a field detector is severly impaired.

BRIEF DESCRIPTION OF THE PRESENT INVENTION

It is an object of the present invention to provide an integrated optics Pockels cell voltage sensor.

Broadly the present invention relates to a voltage sensor comprising a Pockels cell composed of a wave guide that supports propagation of two orthogonal modes of polarized light integrated into an electro-optical medium, said orthogonal modes of polarization being on x and y axes and each having its propagation constant affected to a different degree than the other when said medium is subjected to an electric field, said integrated wave guide extends along z axis of said medium substantially perpendicular to said x and y axes, means to direct light polarized at an angle intermediate said orthogonal x and y axes into one end of said wave guide, means to receive light from said wave guide, said means to receive polarizing light received from said wave guide parallel to a polarization plane to said z axis and at a second angle to said x and y axes and means for measuring the amount of said received light polarized parallel to said polarization plane to determine the electric field to which said detector is subjected.

Preferably said means to direct will comprise a first polarization maintaining optical fibre means connected to said medium in a position to direct said light polarized at said angle intermediate said orthogonal x and y axes into said one end of said wave guide, and said means to receive will comprise a second polarization maintaining optical fibre connected to said medium and oriented to receive light transmitted from said wave guide at said second angle to said x and y axes.

Preferably said angle and second angles will be substantially the same when measured from said x axis.

Preferably said means for measuring will measure the optical power in each of two orthogonal modes of said second polarization maintaining optical fibre one of which receives light polarized parallel to said second angle.

Preferably said means for measuring will further include means to sum the instantaneous optical powers in each of said orthogonal modes of said second polarization maintaining optical fibre to determine the total optical power and will provide a ratio of one of said measured instantaneous optical powers to said total optical power to determine the instantaneous electric field.

In some instances an optical buffer layer may be applied to and overlie the face of said medium along which said wave guide is formed.

A conducting layer (metal or the like) may in some embodiments be applied to the side of said buffer layer remote from said medium.

Preferably said electro-optical medium will be formed from lithium niobate crystal and said integrated wave guide will be formed by a single strip of titanium diffused into said lithium niobate crystal.

It is preferred that said lithium niobate crystal will be a y-cut lithium niobate crystal with said wave guide aligned with the z axis of said crystal.

The present invention also relates to a method of measuring an electric field strength comprising immersing a Pockels cell formed by an electro-optical medium having a straight line wave guide formed therein parallel to a z axis of said medium. said wave guide having rates of light propagation along its x and y axes which change when said Pockels cell is subjected to different electric fields, orienting said Pockels cell relative to said field to be measured so that the direction of said field is substantially parallel to said y axis and passing light polarized at an angle intermediate said x and y axes into said wave guide and measuring the optical power of light transmitted by said wave guide in a selected plane of polarization to determine the strength of said field.

Preferably said selected plane of polarization will be substantially parallel to said z axis and oriented at said angle intermediate said x and y axes.

Preferably said measuring will also measure light transmitted by said wave guide in a second plane of polarization substantially perpendicular to said selected plane.

BRIEF DESCRIPTION OF THE DRAWINGS

Further features, objects and advantages will be evident from the following detailed description of the preferred embodiments of the present invention taken in conjunction with the accompanying drawings, in which:

FIG. 1 is an isometric illustration of an integrated Pockels cell detector of the present invention.

FIG. 2 shows the detector of the present invention having a buffer layer applied thereto and mounted in position on a high voltage conductor to measure the field.

FIG. 3 is a section along the lines 3—3 of FIG. 2 showing the sensor of the invention applied directly to a round conductor.

FIG. 3A shows the sensor applied to a port in a surrounding wall of a gas-insulated electrical conductor.

FIG. 4 illustrates the polarization angle of the light entering the wave guide at the zero plane, and FIG. 5 illustrates the orthogonal polarization angles at which polarized light emitted from the wave guide is detected.

DESCRIPTION OF THE PREFERRED EMBODIMENTS

As shown in FIG. 1, the voltage sensor 10 of the present invention has a light source 12 (including means to polarize light) that directs polarized light into a first polarization maintaining optical fibre element 14. The optical fibre element 14 maintains the polarization of the light along the length of the element 14 and delivers the polarized light to an integrated optics Pockels cell 15 to which it is connected.

The Pockels cell of the present invention is formed by an electro-optic medium or crystal 16 having an integrated wave guide 18 formed therein. The element 14 delivers polarized light to an input end of the wave guide 18. A second polarization maintaining optical fibre element 20 is connected to the crystal 16 in a position to receive, preferably in two orthogonal selected planes, light leaving the wave guide 18 and deliver it to a light intensity detector 22 that measures the amount of light transmitted from the source 12, passing through the Pockels cell 15 and transmitted to the detector 22 in the two selected planes. The amount of light so detected is related to the strength of the electric field in which the device, in particular the Pockels cell 15 is immersed, as will be described in more detail hereinbelow.

The Pockels cell crystal 16 preferably is formed from a material such as a lithium niobate crystal and the wave guide 18 is formed therein by diffusing a straight of material preferably titanium niobate crystal substrate to produce a straight line wave guide extending substantially the full length of the crystal 16. The wave guide 18 is aligned with the z axis of the crystal. Preferably the lithium niobate crystal will be a y-cut crystal arranged as indicated with the x, y and z axis as shown. The changes in the rates of light propagation along the wave guide 18 when subjected to an electric field are different in the x and y directions so that the x and y components of polarized light travel along the wave guide 18 at different rates. These new rates of the x and y components are dependent on the strength of the electric field to which the device is subjected. It is this property that is used to determine the field strength of the electric field.

The light source 12 may be any suitable light source. However, the first and second or incoming and outgoing polarization maintaining optic fibre elements 14 and 20 respectively are each adapted to resolve and transmit only light polarized in two selected orthogonal planes. The elements 14 and 20 are attached to the crystal 16 at an orientation so that there planes of transmission of polarized light are substantially aligned at opposite ends of the wave guide 18 so that the polarized light transmitted by the optical fibre element 14 and 20 are substantially at the same angle to the y (or x) axis of the crystal 16.

The precise alignment of these selected transmitting planes of the incoming and outgoing optic fibre elements 14 and 20 is not essential, however they normally will be at about substantially the same angle to the y (or x) axis of the crystal 16.

It has been found that the precise alignment of the polarization planes of the first and second optical fibre elements is not always the most efficient and thus in some cases it may be desirable to empirically position the first and second optical fibres 14 and 20 relative to the Pockels cell 15 in particular to the wave guide 18.

A proposed system to set the polarization angle $A_i$ at the incoming polarization angle at the input end 24 of the wave guide 18 (i plane see FIG. 4) and the polarization angle $A_e$ at the outgoing end 26 of the wave guide 18 (e plane see FIG. 5) is as follows:

The incoming angle $A_i$ is set by aligning the element 14 with the wave guide 18 and relatively rotating the incoming optical fibre element 14 and the Pockels cell 15 around the z axis of the wave guide 18, measuring the power of the light received at the outgoing end 26 polarized parallel to the x axis and the power polarized parallel to the y axis the of the wave guide 18 and fixing the element 14 to the Pockels cell 15 at the angle $A_i$ where the power measured parallel to the x axis is substantially equal to the power measured parallel to the y axis.

After the element 14 has been fixed to the Pockels cell at the desired angle $A_i$ the element 20 is positioned in alignment to receive light from the guide 18 and the element 20 and Pockels cell 15 are rotated relative to each other around the z axis of the guide 18 until the desired light signals are obtained along the selected axes when the Pockels cell 15 is being subjected to an electric field of changing strength. The changing strength of the electrical field causes the optical power along the selected axis to vary between a maxima and a minima. The angle $A_e$ is fixed at the angle that provides the greatest difference between the maxima and minima measured. If two orthogonal axes are to be used the maximum optical power measured along both axes should be substantially equal, as should the minimum optical powers.

Generally the plane of polarization of the incoming light entering the guide 18 and one of the selected orthogonal planes along which light is transmitted in the element 20 will be substantially the same (i.e. angles $A_i$ and $A_e$ as will be described below will be substantially equal). When the elements 14 and 20 are properly oriented they are fixed to the crystal 16 by any suitable means (generally an adhesive).

Preferably the angles $A_i$ and $A_e$ will be substantially equal and will be equal to about 45° to the x (or y) axis of the wave guide 18.

In a typical Pockels cell crystal 16 used for the present invention, the dimension L will be in the range of about 10 to 50 millimeters, width dimension W about 1 to 5 millimeters and the thickness t about 0.1 to 1 millimeter.

FIGS. 2 and 3 show the Pockels cell 15 portion of the sensor 10 mounted in position on a conductor 32. The sensor 10 is positioned on the conductor 32 in a manner such that the field as indicated by the arrows 31 in FIGS. 1 and 3 extends substantially parallel to the y axis of the crystal. This maximizes the difference in the rates of light propagation for light polarized parallel to the x and y axes. By positioning the device 10 substantially in contact with the conductor 32 this relationship of the field to the y axis is automatically established.

The sensor (Pockels cell 15) need not be positioned directly on the conductor and in many cases will not be so positioned as in the case of an insulation covered conductor.

With the device 15 mounted on the conductor 32 it may well be desirable to modify the device 15 illustrated in FIG. 1 by applying an optical buffer layer 34 covering over the wave guide 18. Generally such a buffer layer 34 (as illustrated in FIG. 3) will extend at least a small distance on opposite sides of the guide 18 or for convenience may cover the whole face of the crystal 16 along which the wave guide 18 has been formed thereby to better ensure confinement of the light transmitted to the wave guide 18 particularly when a conducting metal layer or the like such as that indicated 31 is provided. The conducting metal layer 36 so provided helps to insure the field applied to the Pockels cell 15 is parallel to the y axis.

FIG. 3A illustrates an installation wherein the Packels cell 15 portion of the sensor 10 has been positioned on an access port 40 of the grounded housing 42 of a gas-insulated duct in which a central conductor 44 is positioned.

The detector 22 may operate in a variety of different ways to provide a reading of the strength of the electrical field, but it is preferred to measure the optical power outputs polarized parallel to the selected orthogonal planes $P_1$ and $P_2$, to sum the outputs and to ratio the output on one of the planes $P_1$ or $P_2$ to the sum to determine the strength of electric field being sensed. It is also possible to measure only the output on a single plane to obtain a measurement from which the strength of the electric field may be determined.

Having described the invention, modifications will be evident to those skilled in the art without departing from the spirit of the invention as defined in the appended claims.

I claim:

1. A voltage sensor comprising a Pockels cell composed of a wave guide that supports propagation of two orthogonal modes of polarized light integrated into an electro-optical medium, said orthogonal modes of polarization being on x and y axes and each having its propagation constant affected to a different degree than the other when said medium is subjected to an electric field, said integrated wave guide extends along a z axis of said medium substantially perpendicular to said x and y axes, means to direct light polarized at an angle intermediate said orthogonal x and y axes into one end of said wave guide, means to receive light transmitted from said wave guide, said means to receive polarizing light received from said wave guide parallel to a polarization plane parallel to said z axis and at a second angle to said x and y axes and means for measuring the amount of said received light polarized parallel to said polarization plane to determine the strength of the electric field to which said voltage sensor is subjected.

2. A voltage sensor as defined in claim 1 wherein said means to direct includes a first polarization maintaining optical fibre means connected to said medium in a position to direct said light polarized in a selected plane at an angle intermediate said orthogonal x and y axes into said one end of said wave guide.

3. A voltage sensor as defined in claim 2 wherein said means to receive includes a second polarization maintaining optical fibre transmitting light along said polarization plane, said second polarization maintaining optical fibre being connected to said medium and oriented to transmit light from said wave guide with said polarization plane at the point where said second optical fibre receives light from said wave guide being parallel to said z axis and oriented at a second angle to said x and y axes.

4. A voltage sensor as defined in claim 3 wherein said angle and second angle measured from said x axis are substantially equal.

5. A voltage sensor as defined in claim 4 wherein said second polarization maintaining optic fibre transmits polarized light along a second polarization plane perpendicular to said polarization plane and said means for measuring also measures the power of light transmitted along said second polarization plane in said second polarization maintaining optic fibre.

6. A voltage sensor as defined in claim 5 wherein said means for measuring sums instantaneous optical powers measured in each of said polarization plane and said second polarization plane in said second polarization maintaining optic fibre to determine total optic power and provides a ratio of one of said measured instantaneous optical powers to said total optical power to determine the instantaneous strength of said electric field.

7. A voltage sensor as defined in claim 4 wherein said medium is a crystal.

8. A voltage sensor as defined in claim 7 wherein said crystal is formed from lithium niobate and said wave guide formed by a straight line strip of titanium diffused into said lithium niobate crystal.

9. A voltage sensor as defined in claim 7 further comprising an optical buffer layer overlying a face of said crystal along which said wave guide is formed.

10. A voltage sensor as defined in claim 8 wherein said lithium niobate crystal is y- cut lithium niobate and said wave guide is aligned with the z axis of said crystal.

11. A voltage sensor as defined in claim 4 further comprising an optical buffer layer on the side of said medium adjacent to said wave guide.

12. A voltage sensor as defined in claim 11 further comprising a conducting layer on the side of said buffer layer remote from said medium.

13. A method of measuring an electric field strength comprising immersing a Pockels cell formed by an electro-optical medium having a straight line wave guide formed therein parallel to a z axis of said medium, said wave guide having different rates of light propagation along its x and y axes which change when said Pockels cell is subjected to different electric fields, orienting said Pockels cell relative to said field to be measured to that the direction of said field is substantially parallel to said y axis and passing light polarized at an angle intermediate said x and y axes into said wave guide and measuring the instantaneous optical power of light transmitted by said wave guide in a selected plane of polarization to determine the strength of said field.

14. A method as defined in claim 13 wherein said selected plane of polarization is at substantially the same angle to said x and y axes as said angle intermediate said x and y axes.

15. A method as defined in claim 14 wherein said measuring measures the instantaneous optical power of light transmitted by said wave guide in a second plane orthogonal to said selected plane.

16. A method as defined in claim 15 wherein said strength of said field is determined by summing said instantaneous optical powers measured in each of said orthogonal planes to determine total optical power and providing a ratio of one of said measured instantaneous optical powers to said total optical power to determine the instantaneous strength of the electric field.

* * * * *